United States Patent [19]
Rickerby

[11] Patent Number: 6,110,604
[45] Date of Patent: Aug. 29, 2000

[54] METALLIC ARTICLE HAVING A THERMAL BARRIER COATING AND A METHOD OF APPLICATION THEREOF

[75] Inventor: David S Rickerby, Derby, United Kingdom

[73] Assignee: Rolls-Royce, PLC, London, United Kingdom

[21] Appl. No.: 09/127,891

[22] Filed: Aug. 3, 1998

[30] Foreign Application Priority Data

Aug. 15, 1997 [GB] United Kingdom ............... 9717245

[51] Int. Cl.[7] ................ B32B 15/00; B32B 18/00; C23C 14/00; C23C 16/00
[52] U.S. Cl. ............... 428/623; 428/141; 428/632; 428/633; 416/241 R; 416/241 B; 427/248.1; 427/255.19; 427/566; 427/567; 204/192.1
[58] Field of Search .................... 428/141, 472, 428/632, 623, 633; 416/241 R, 241 B; 427/566, 567, 248.1, 255.19; 204/192.1

[56] References Cited

U.S. PATENT DOCUMENTS

| | | |
|---|---|---|
| 4,764,089 | 8/1988 | Strangman ............... 415/174 |
| 5,350,599 | 9/1994 | Rigney et al. . | |
| 5,512,382 | 4/1996 | Strangman . | |
| 5,652,044 | 7/1997 | Rickerby ............... 428/216 |

FOREIGN PATENT DOCUMENTS

| | | |
|---|---|---|
| 0 705 911 A1 | 4/1996 | European Pat. Off. . |
| WO 93/18199 | 9/1993 | WIPO . |

*Primary Examiner*—Timothy M. Speer
*Assistant Examiner*—Bryant Young
*Attorney, Agent, or Firm*—Oliff & Berridge, PLC

[57] ABSTRACT

A metallic article includes a bond coating and a ceramic thermal barrier coating on the bond coating. The ceramic thermal barrier coating includes a plurality of columnar grains extending substantially perpendicularly to the surface of the metallic article. Each columnar gain has a plurality of first layers, a plurality of second layers and a plurality of third layers. The first layers have a different structure from the second layers and the third layers. The second layers have a different structure from the third layers. The first layers have the same composition as the third layers. The second layers have a greater proportion of voids than the first layers and the third layers. The voids reduce the thermal conductivity of the thermal barrier coating. The second layers may also have a different composition from the first layers and the third layers to reduce the thermal conductivity.

53 Claims, 6 Drawing Sheets

METALLIC ARTICLE HAVING A THERMAL BARRIER COATING AND A METHOD OF APPLICATION THEREOF

BACKGROUND OF THE INVENTION

The present invention relates to a thermal barrier coating applied to the surface of a superalloy article e.g. a gas turbine engine turbine blade, and to a method of applying the thermal barrier coating. The invention particularly relates to ceramic thermal barrier coatings.

The constant demand for increased operating temperature in gas turbine engines was initially met by air cooling of the turbine blades and turbine vanes and the development of superalloys from which to manufacture the turbine blades and turbine vanes, both of which extended their service lives. Further temperature increases necessitated the development of ceramic coating materials with which to insulate the turbine blades and turbine vanes from the heat contained in the gases discharged from the combustion chambers, again the operating lives of the turbine blades and turbine vanes was extended.

It is known in the prior art to apply these ceramic coating materials by the thermal, or plasma, spray process onto a suitable bond coating, for example a MCrAlY alloy bond coating, which has been applied to the metallic substrate.

It is also known in the prior art to apply these ceramic coating materials by the physical vapour deposition process onto a suitable bond coating which has an alumina interface layer, for example a MCrAlY alloy bond coating or a diffusion aluminide bond coating, which has been applied to the metallic substrate.

It is also known in the prior art to apply these ceramic coating materials by plasma spraying or physical vapour deposition processes onto an oxide layer on the metallic substrate.

The ceramic thermal barrier coatings deposited by the physical vapour deposition process have benefits over the ceramic thermal barrier coating deposited by plasma spraying. The main benefit is improved thermal shock resistance due So the columnar structure of the ceramic thermal barrier coating produced by the physical vapour deposition process.

One problem associated with thermal barrier coatings produced by physical vapour deposition is that the thermal conductivity is greater than the thermal conductivity of the same thermal barrier coating produced by plasma spraying.

It is known from International Patent Application WO9318129A to produce a columnar ceramic thermal barrier coating which comprises a plurality of layers with interfaces between the adjacent layers. Each columnar ceramic grain extends perpendicularly to the surface of the metallic article. Each columnar grain has a plurality of layers and adjacent layers have different structures. The interfaces between adjacent layers decrease the thermal conductivity of the ceramic thermal barrier coating. These layers are produced by alternate physical vapour deposition and plasma assisted physical vapour deposition.

SUMMARY OF THE INVENTION

The present invention seeks to provide a metallic article having a columnar ceramic thermal barrier coating in which the ceramic thermal barrier coating has reduced thermal conductivity. The present invention also seeks to provide a method of applying a ceramic thermal barrier coating by physical vapour deposition to produce a columnar ceramic thermal barrier coating which has reduced thermal conductivity.

Accordingly the present invention provides a metallic article comprising a bond coating on the metallic article and a ceramic thermal barrier coating on the bond coating, the ceramic thermal barrier coating comprising a plurality of columnar grains extending substantially perpendicularly to the surface of the metallic article, each columnar grain having at least one first layer, and at least one second layer, the at least one first layer having a different structure to the at least one second layer, the at least one second layer having a greater proportion of voids than the at least one first layer and the voids containing an inert gas to stabilize the voids.

Preferably each columnar grain has at least one third layer, the third layer having a different structure to the at least one first layer and the at least one second layer, the at least one first layer having the same composition as the at least one third layer, the at least one second layer having a greater proportion of voids that the at least one third layer.

Preferably the at least one second layer has a different composition to the at least one first layer.

Preferably the at least one second layer has a different composition to the at least one first layer and the at least one third layer.

Preferably there are a plurality of first layers and a plurality of second layers. Preferably there are a plurality of third layers. Each second layer may be arranged between a third layer and a first layer, the second layer is adjacent to the third layer and the first layer. Each second layer may be arranged between two third layers, the second layer is adjacent the third layers. Each second layer may be arranged between two first layers, the second layer is adjacent the first layers.

Preferably some of the first layers and some of the second layers have a thickness in the range 0.5 to 3 microns to reduce photon thermal conductivity. Preferably some of the first layers and some of the second layers have a thickness in the range 0.3 to 2 nanometers to reduce phonon thermal conductivity. Preferably some of the third layers have a thickness in the range 0.5 to 3 microns and some of the third layers have a thickness in the range 0.3 to 2 nanometers.

Preferably the bond coating comprises an aluminum containing bond coating on the metallic article, the aluminum containing bond coating has an alumina surface layer, the ceramic thermal barrier coating is arranged on the alumina layer.

The aluminum containing bond coating may comprise a MCrAlY bond coating or a diffusion aluminide coating.

Preferably the bond coating comprises a MCrAlY bond coating on the metallic article, a platinum enriched MCrAlY layer on the MCrAlY bond coating, a platinum aluminide layer on the platinum enriched MCrAlY layer, the platinum aluminide layer has an alumina surface layer, the ceramic thermal barrier coating is arranged on the alumina layer.

Alternatively the metallic article has an alumina surface layer, the ceramic thermal barrier coating is arranged on the alumina layer.

The metallic article may comprise a nickel superalloy article or a cobalt superalloy article.

The metallic article may comprise a turbine blade or a turbine vane.

The ceramic thermal barrier coating may comprise zirconia, preferably yttria stabilized zirconia. The ceramic thermal barrier coating may comprise a mixture of a first ceramic and a second ceramic, the second ceramic comprises an element with a lower sputtering threshold than the elements of the first ceramic. The ceramic thermal barrier coating may comprise a mixture of zirconia and alumina, preferably a mixture of yttria stabilized zirconia and alumina. The aluminum has a lower sputtering threshold than the zirconium and yttrium and therefore the first and third layers have substantially the same levels of alumina whereas the second layer has a reduced level of, preferably no, alumina compared to the first and third layers.

The present invention also provides a method of applying a ceramic thermal barrier coating to a metallic article, comprising the steps of: forming a bond coating on the metallic article, applying a ceramic thermal barrier coating to the bond coating by applying a first voltage to the metallic article and depositing at least one first columnar grained layer by vapour deposition, substantially instantaneously applying a second different voltage to the metallic article and depositing at least one second columnar grained layer by plasma assisted vapour deposition to provide differences in structure between the at least one first layer and the at least one second layer, depositing the ceramic thermal barrier coating in an atmosphere containing an inert gas and selecting the second voltage such that it is sufficient to trap the inert gas in the at least one second layer to provide a greater proportion of voids in the at least one second layer, the voids containing the inert gas stabilize the voids.

Preferably the method comprises substantially instantaneously applying a third different voltage to the metallic article and depositing at least one third columnar grained layer by plasma assisted vapour deposition.

The method may comprise applying a first voltage less than zero voltage and applying a second voltage less than the first voltage.

Preferably the first voltage is zero volts, the third voltage is less than the first voltage and the second voltage is less than the third voltage. The voltage may be a DC voltage or a RF voltage. The voltage is a negative voltage.

Preferably the at least one second layer has a different composition to the at least one first layer. Preferably the second layer has a different composition to the at least one third layer.

Preferably the method comprises depositing a plurality of first layers, a plurality of second layers and a plurality of third layers. The method may comprise depositing each second layer between a third layer and a first layer, and such that the second layer is adjacent to the third layer and the first layer. The method may comprise depositing each second layer between two third layers, and the second layer is adjacent the third layers. The method may comprise depositing each second layer between two first layers, and the second layer is adjacent the first layers.

Preferably some of the first layers and some of the second layers have a thickness in the range 0.5 to 3 microns to reduce photon thermal conductivity. Preferably some of the first layers and some of the second layers have a thickness in the range 0.3 to 2 nanometers to reduce phonon thermal conductivity. The layers may have the same thickness. Preferably some of the third layers have a thickness in the range 0.5 to 3 microns and some of the third layers have a thickness in the range 0.3 to 2 nanometers.

Preferably the vapour deposition process is physical vapour deposition. The physical vapour deposition process may be electron beam evaporation, sputtering or arc evaporation.

The method may comprise applying an aluminum containing bond coating on the metallic article and forming an alumina layer on the aluminium containing bond coating.

The aluminium containing bond coating may comprise a MCrAlY alloy, an aluminide or a platinum aluminide.

The method may comprise applying a MCrAlY bond coating on the metallic article, forming a platinum enriched MCrAlY layer on the MCrAlY bond coating, forming a platinum aluminide layer on the platinum enriched MCrAlY layer, and forming an alumina surface layer on the platinum aluminide layer.

The method may comprise forming an alumina surface layer on the metallic article.

The metallic article may be formed from a nickel superalloy article or a cobalt superalloy article.

The metallic article may comprise a turbine blade or a turbine vane.

The ceramic thermal barrier coating may comprise zirconia, preferably zirconia stabilised with yttria. The ceramic thermal barrier coating may comprise a mixture of a first ceramic and a second ceramic, the second ceramic comprises an element with a lower sputtering threshold than the elements of the first ceramic. The ceramic thermal barrier coating may comprise a mixture of zirconia and alumina, preferably a mixture of yttria stabilised zirconia and alumina. The aluminum has a lower sputtering threshold than the zirconium and yttrium and therefore the first and third layers have substantially the same levels of alumina whereas the second layer has a reduced level of, preferably no, alumina compared to the first and third layers.

BRIEF DESCRIPTION OF THE DRAWINGS

The present invention will be more fully described by way of example with reference to the accompanying drawings, in which.

DETAILED DESCRIPTION OF THE PREFERRED EMBODIMENTS

Figure 1:
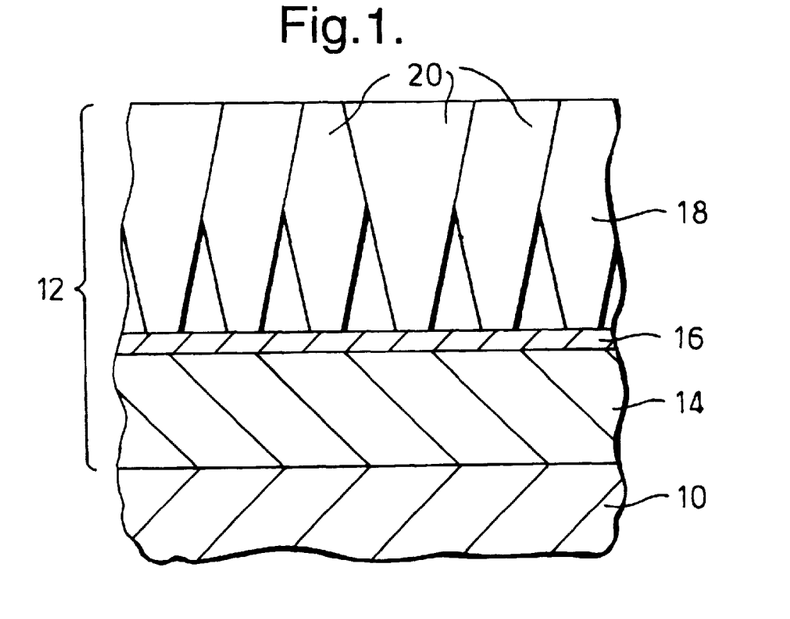
FIG. 1 is a cross-sectional diagrammatic view through a metallic article having a prior art thermal barrier coating.

Referring to FIG. 1, illustrating the prior art, there is shown part of a superalloy article 10 provided with a multi-layer thermal barrier coating indicated generally by numeral 12. It is shown in the as manufactured condition. The thermal barrier coating 12 comprises a bond coating 14 on the superalloy substrate 10, an oxide layer 16 on the bond coating 14 and a ceramic thermal barrier coating 18 on the oxide layer 16. The bond coating 14 is generally an aluminum containing alloy for example a MCrAlY alloy, a nickel aluminide, a cobalt aluminide or a platinum aluminide. The oxide layer generally comprises alumina together with other oxides. The ceramic thermal barrier coating comprises zirconia usually stabilized by additions of yttria, magnesia etc.

The ceramic thermal barrier coating 18 comprises a plurality of columnar ceramic grains 20 which extend substantially perpendicularly to the surface of the superalloy substrate 10.

The multi-layer thermal barrier coating 12 is applied on the superalloy article 10 by firstly depositing a MCrAlY alloy bond coating 14 by plasma spraying or physical vapour deposition or forming a nickel aluminide bond coating 14 by diffusion aluminizing or forming a platinum aluminide bond coating 14 by platinum modified diffusion aluminizing. The ceramic thermal barrier coating 18 is then applied onto the bond coating 14 by physical vapour deposition, usually electron beam physical vapour deposition. The oxide layer 16 forms on the bond coating 14 while the superalloy article 10 is heated up to the operating temperature in an electron beam physical vapour deposition chamber due to the presence of oxygen. The superalloy article 10 is rotated in the electron beam physical vapour deposition chamber in the ceramic vapours to produce the ceramic thermal barrier coating 18.

Figure 2:
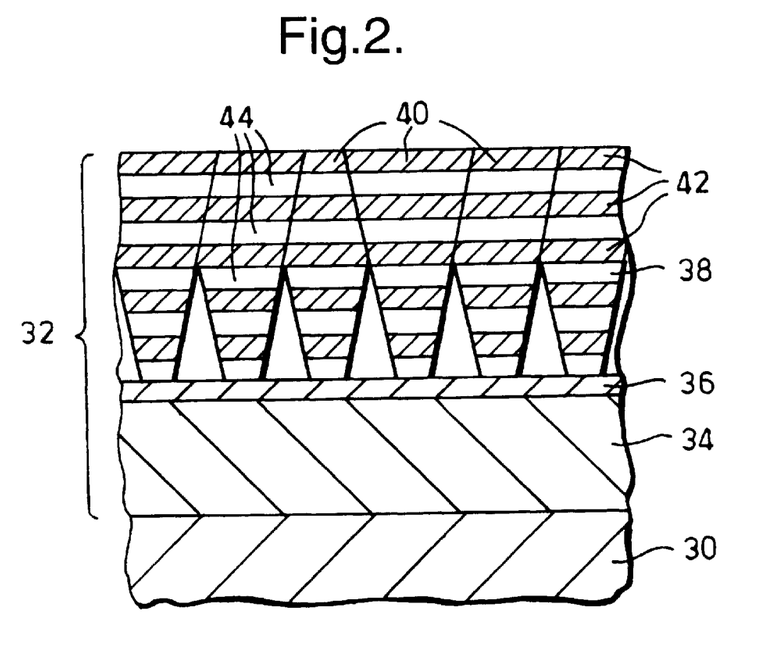
FIG. 2 is a cross-sectional diagrammatic view through a metallic article having a further prior art thermal barrier coating.

Referring to FIG. 2, illustrating further prior art, there is shown part of a superalloy article 30 provided with a multi-layer thermal barrier coating indicated generally by numeral 32. It is shown in the as manufactured condition. The thermal barrier coating 32 comprises a bond coating 34 on the superalloy substrate 30, an oxide layer 36 on the bond coating 34 and a ceramic thermal barrier coating 38 on the oxide layer 36. The bond coating 34 is generally an aluminum containing alloy for example a MCrAlY alloy, a nickel aluminide, a cobalt aluminide or a platinum aluminide. The oxide layer generally comprises alumina together with other oxides. The ceramic thermal barrier coating comprises zirconia usually stabilized by additions of yttria, magnesia etc.

The ceramic thermal barrier coating 38 comprises a plurality of columnar ceramic grains 40 which extend substantially perpendicularly to the surface of the superalloy substrate 30. Furthermore it is seen that the columnar grains 40 of the ceramic thermal barrier coating 38 comprise a plurality of layers 42 and 44. The adjacent layer 42 and 44 have the same composition, but have different structures, all of the alternate layers 42 have the same structure and all of the alternate layers 44 have the same structure. These differences in structure produce interfaces between the layers which reduce the thermal conductivity of the ceramic thermal barrier coating. This is described more fully in International Patent Application WO9318199A.

The multi-layer thermal barrier coating 32 is applied on the superalloy article 30 by firstly depositing a MCrAlY alloy bond coating 34 by plasma spraying or physical vapour deposition or forming a nickel aluminide bond coating 34 by diffusion aluminizing or forming a platinum aluminide bond coating 34 by platinum modified diffusion aluminizing. The ceramic thermal barrier coating 38 is then applied onto the bond coating 34 by physical vapour deposition, usually electron beam physical vapour deposition. The oxide layer 36 forms on the bond coating 34 while the superalloy article 30 is heated up to the operating temperature in an electron beam physical vapour deposition chamber due to the presence of oxygen. During the deposition of the ceramic thermal barrier coating, the ceramic thermal barrier coating is alternately deposited by plasma assisted physical vapour deposition and by physical vapour deposition. During plasma assisted physical vapour deposition a DC or RF bias voltage is applied to the metallic article 30.

Figure 3:
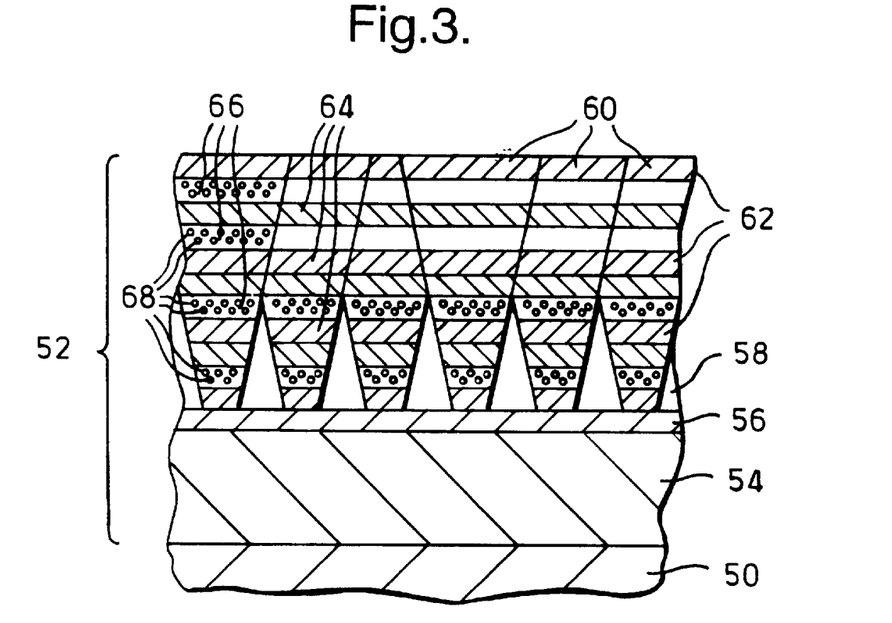
FIG. 3 is a cross-sectional diagrammatic view through a metallic article having a thermal barrier coating according to the present invention.

Referring to FIG. 3, illustrating the present invention, there is shown part of a superalloy article 50 provided with a multi-layer thermal barrier coating indicated generally by numeral 52. It is shown in the as manufactured condition. The thermal barrier coating 52 comprises a bond coating 54 on the superalloy substrate 50, an oxide layer 56 on the bond coating 54 and a ceramic thermal barrier coating 58 on the oxide layer 56. The bond coating 54 is generally an aluminum containing alloy for example a MCrAlY alloy, a nickel aluminide, a cobalt aluminide or a platinum aluminide. The oxide layer generally comprises alumina together with other oxides.

The ceramic thermal barrier coating 58 comprises a plurality of columnar ceramic grains 60 which extend substantially perpendicularly to the surface of the superalloy substrate 50. Furthermore it is seen that the columnar grains 60 of the ceramic thermal barrier coating 58 comprise a plurality of first layers 62, a plurality of second layers 66 and a plurality of third layers 64. The layers 62, 64 and 66 have different structures and all of the first layers 62 have the same structure, all of the second layers 66 have the same structure and all of the third layers 64 have the same structure.

These differences in structure produce interfaces between the layers 62, 64 and 66 which reduce the thermal conductivity of the ceramic thermal barrier coating 58. Each of these layers have voids. The voids in the first layer are naturally occurring thermal vacancies. The voids in the second and third layers are due to the entrapment of gas into the ceramic during the deposition of the ceramic thermal barrier coating 58. However, the second layers 66 have a greater proportion of voids 68 than do the first layers 62 or the third layers 64. This greater proportion of voids 68 in the second layers 66 also reduces the phonon thermal conductivity of the ceramic thermal barrier coating 58.

The thickness of some of the first layers, some of the second layers and some of the third layers may be in the range 0.5 to 3 microns to reduce photon thermal conductivity. Alternatively the thickness of some of the first layers, some of the second layers and some of the third layers may be in the range 0.3 to 2 nm to reduce phonon thermal conductivity.

The multi-layer thermal barrier coating 52 is applied on the superalloy article 50 by firstly depositing a MCrAlY alloy bond coating 54 by plasma spraying or physical vapour deposition or forming a nickel aluminide bond coating 54 by diffusion aluminizing or forming a platinum aluminide bond coating 54 by platinum modified diffusion aluminizing. The ceramic thermal barrier coating 58 is then applied onto the bond coating 54 by physical vapour deposition, usually electron beam physical vapour deposition. The oxide layer 56 forms on the bond coating 54 while the superalloy article 50 is heated up to the operating temperature in an electron beam physical vapour deposition chamber due to the presence of oxygen.

Figure 7:
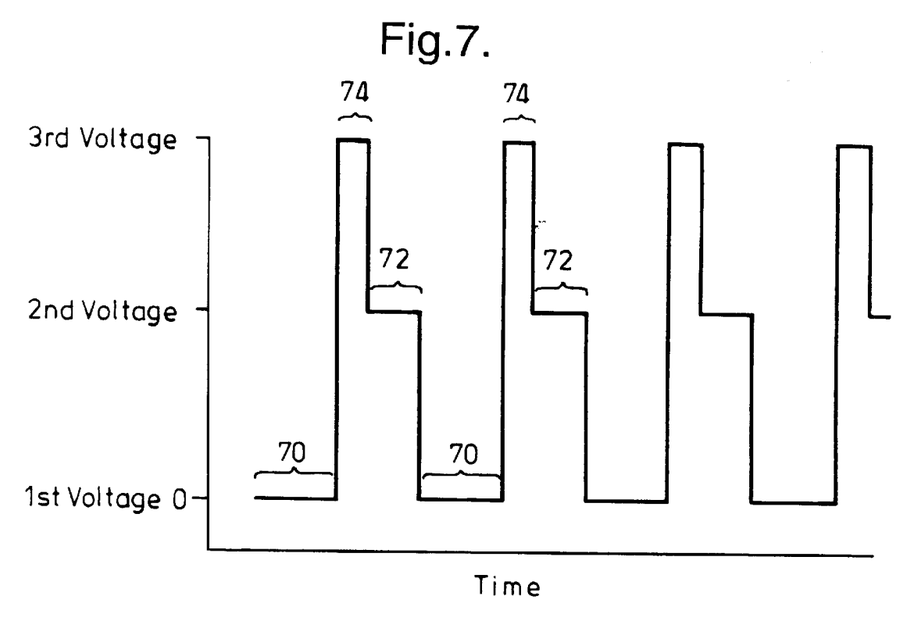
FIG. 7 is a graph showing voltage applied to the metallic article against time during application of a thermal barrier coating according to the present invention.

During the deposition of the ceramic thermal barrier coating 58, the ceramic thermal barrier coating 58 is deposited by plasma assisted physical vapour deposition and by physical vapour deposition as is shown in FIG. 7. During physical vapour deposition, at time periods 70, no voltage is applied to the superalloy article 50 and the first layers 62 are formed during the physical vapour deposition time periods 70. During plasma assisted physical vapour deposition, at time periods 72 and 74, a DC or RF bias voltage is applied to the superalloy article 50. The voltage at time periods 72 is less negative than the voltage at time periods 74 and the third layers 64 are formed during the plasma assisted physical vapour deposition time periods 72 and the second layers 66 are formed during the plasma assisted physical vapour deposition time periods 74.

The plasma assisted physical vapour deposition time periods 72 and 74 produce changes to the structure of the columnar ceramic grains 60. The time periods 74 produce a greater change in the structure than the time periods 72. Additionally during the time periods 74 a greater amount of the inert gas in the deposition chamber is trapped in the second layers 66, to produce voids 68, due to the increased speed of the ceramic particles being deposited.

Figure 4:
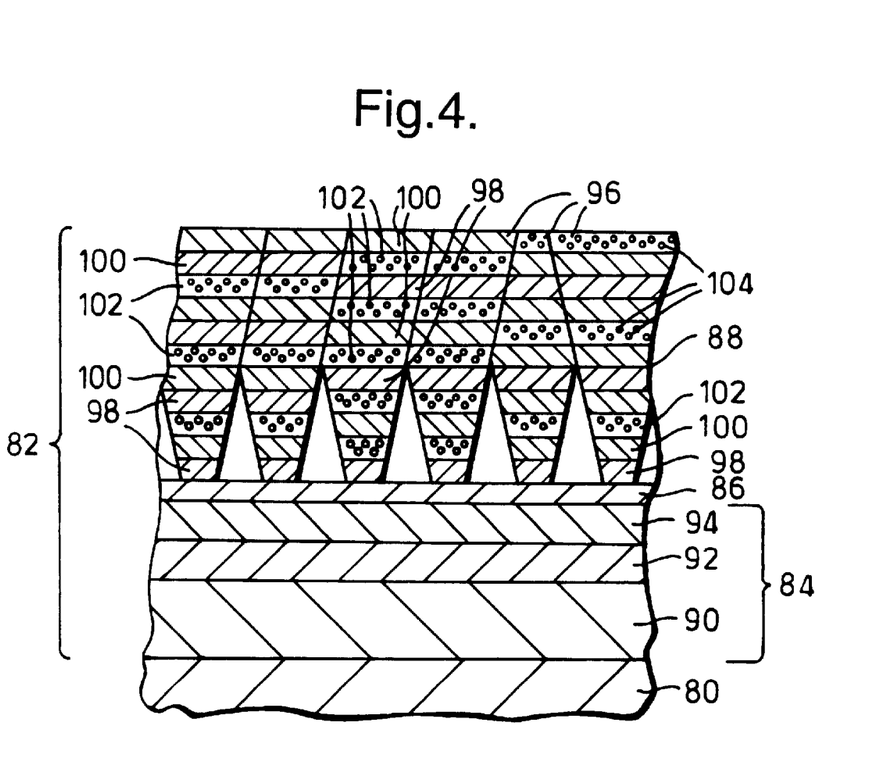
FIG. 4 is a cross-sectional diagrammatic view through a metallic article having a further thermal barrier coating according to the present invention.

Referring to FIG. 4, illustrating a further embodiment of the present invention, there is shown part of a superalloy article 80 provided with a multi-layer thermal barrier coating indicated generally by numeral 82. It is shown in the as manufactured condition. The thermal barrier coating 82 comprises a bond coating 84 on the superalloy substrate 80, an oxide layer 86 on the bond coating 84 and a ceramic thermal barrier coating 88 on the oxide layer 86. The bond coating 84 is generally an aluminum containing alloy for example a MCrAlY alloy coating 90 with a platinum enriched MCrAlY layer 92 and a platinum aluminide layer 94 as described more fully in European Patent Application EP0718419A. The oxide layer 96 generally comprises alumina.

The ceramic thermal barrier coating 88 is similar to that described with reference to FIG. 3 and again comprises columnar ceramic grains 96 which extend substantially perpendicularly to the surface of the superalloy substrate 80. Furthermore it is seen that the columnar grains 96 of the ceramic thermal barrier coating 88 comprise a plurality of first layers 98, a plurality of second layers 102 and a plurality of third layers 100. The layers 98, 100 and 102 have different structures and all of the first layers 98 have the same structure, all of the second layers 102 have the same structure and all of the third layers 100 have the same structure.

These differences in structure produce interfaces between the layers 98, 100 and 102 which reduce the thermal conductivity of the ceramic thermal barrier coating 88. Each of these layers have voids. The voids in the first layer are naturally occurring thermal vacancies. The voids in the second and third layers are due to the entrapment of gas into the ceramic during the deposition of the ceramic thermal barrier coating 88. However, the second layers 102 have a greater proportion of voids 104 than do the first layers 98 or the third layers 100. This greater proportion of voids 104 in the second layers 102 also reduces the phonon thermal conductivity of the ceramic thermal barrier coating 88.

Figure 8:
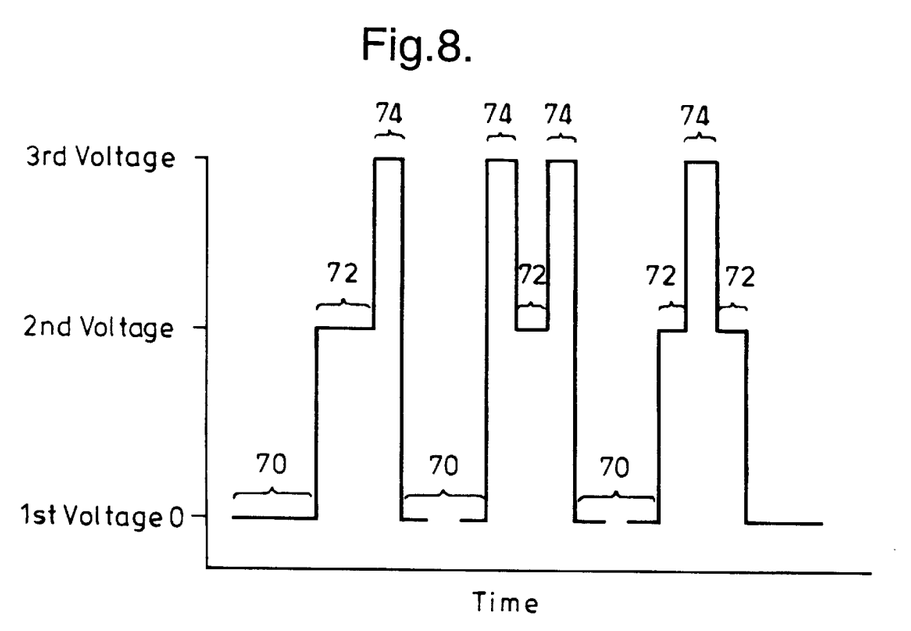
FIG. 8 is a graph showing voltage applied to the metallic article against time during application of a thermal barrier coating according to the present invention.

FIG. 4 shows different arrangements of layers 98, 100 and 102 as produced by the three different voltage waveforms in FIG. 8.

The bond coating 84 is formed by depositing a MCrAlY alloy bond coating, then depositing platinum on the MCrAlY and then heat treating to diffuse the platinum into the MCrAlY.

Figure 5:
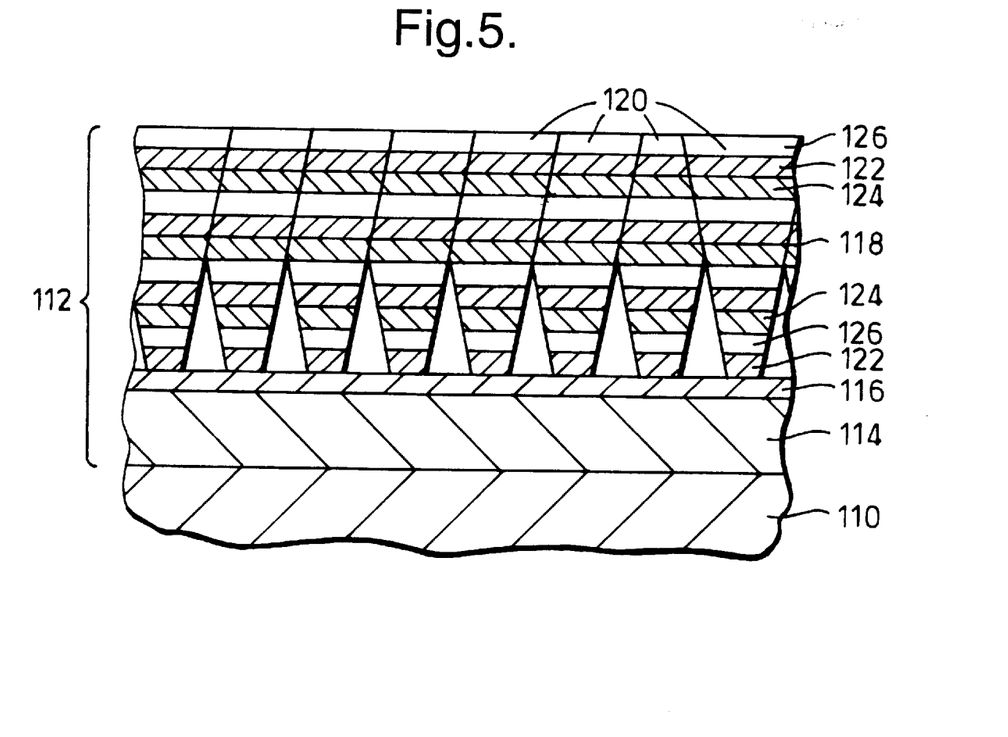
FIG. 5 is a cross-sectional diagrammatic view through a metallic article having a further thermal barrier coating according to the present invention.

Referring to FIG. 5, illustrating a further embodiment of the present invention, there is shown part of a superalloy article 110 provided with a multi-layer thermal barrier coating indicated generally by numeral 112. It is shown in the as manufactured condition. The thermal barrier coating 112 comprises a bond coating 114 on the superalloy substrate 110, an oxide layer 116 on the bond coating 114 and a ceramic thermal barrier coating 118 on the oxide layer 116. The bond coating 114 is generally a platinum enriched gamma and platinum enriched gamma prime layer on the superalloy as described more fully in European Patent Application EP0718420A. The oxide layer 116 generally comprises alumina.

The ceramic thermal barrier coating 118 is similar to that described with reference to FIG. 3 and again comprises columnar ceramic grains 120 which have first, second and third layers 122, 126 and 124 respectively.

The bond coating 114 is formed by depositing platinum on the superalloy and heat treating to diffuse the platinum into the superalloy.

Figure 6:
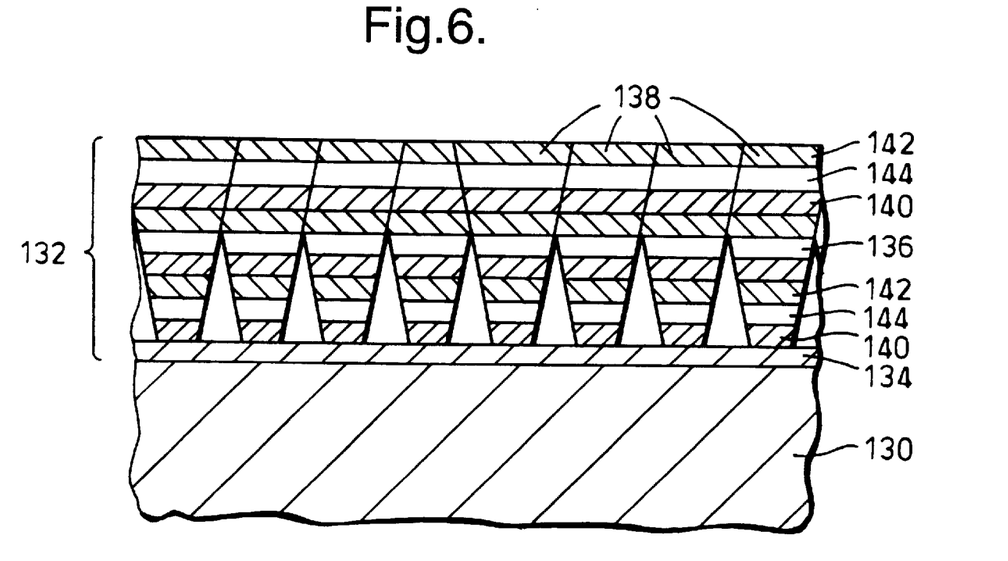
FIG. 6 is a cross-sectional diagrammatic view through a metallic article having a further thermal barrier coating according to the present invention.

Referring to FIG. 6, illustrating a further embodiment of the present invention, there is shown part of a superalloy article 130 provided with a multi-layer thermal barrier coating indicated generally by numeral 132. It is shown in the as manufactured condition. The thermal barrier coating 132 comprises a bond coating 134 on the superalloy substrate 130 and a ceramic thermal barrier coating 136 on the bond coating 134. The bond coating 134 comprises an oxide layer generally of alumina.

The ceramic thermal barrier coating 136 is similar to that described with reference to FIG. 3 and again comprises columnar ceramic grains 138 which have first, second and third layers 140, 144 and 142 respectively.

The bond coating 134 is formed by oxidizing the superalloy article 130.

FIGS. 7 and 8 show different voltage waveforms to produce the first, second and third layers. FIG. 7 shows sequentially producing a first layer, a second layer and a third layer. FIG. 8 shows sequentially producing a first layer, a third layer and a second layer. FIG. 8 also shows sequentially producing a first layer, a second layer, a third layer, and another second layer. FIG. 8 also shows sequentially producing a first layer, a third layer, a second layer and another third layer.

The density of the voids in the second layers, and hence the effectiveness in reducing thermal conductivity of the ceramic thermal barrier coating, is a function of the DC or RF voltage applied to the superalloy article and the mass, or size, of the inert gas ion, or atom. Thus it is preferred to use inert gases with atoms, or ions, of larger radius in the physical vapour deposition process, for example argon, krypton, xenon rather than helium and neon. It is most preferred to use krypton and xenon. The use of krypton or xenon stabilises the voids and because the krypton and xenon have large ionic radii, or large atomic radii, the krypton, or xenon, produces distortion in the crystal structure of the ceramic and hence reduces the phonon thermal conductivity of the ceramic thermal barrier coating. Any other gas, with large atomic radii, large ionic radii or large molecular radii, and which is inert with respect to the particular ceramic of the ceramic thermal barrier coating may be used. It is preferred that the other gas is inert with respect to any other gases in the deposition chamber and is inert to the atmosphere in which the ceramic thermal barrier coating is used.

The inert gas stabilises the voids and prevents sinter densification in use at high operating temperatures.

The inert gas is trapped in the second layers because the relatively high speed of the ceramic particles being deposited, as a result of the relatively high bias voltage applied to the metallic article, ensures that the large inert gas atoms, ions or molecules cannot move out of the way of the ceramic particles and thus become trapped in the ceramic.

The ceramic preferably comprises zirconia, for example yttria stabilized zirconia, although any other suitable ceramic may be used.

The ceramic preferably comprises a mixture of zirconia, or other suitable ceramic, and another ceramic which comprises an element which has a lower sputtering threshold than the zirconium, or the elements of the other suitable ceramic, and which may be preferentially sputtered during plasma assisted physical vapour deposition. For example the ceramic preferably comprises a mixture of yttria stabilized zirconia and alumina. In the case of alumina, the aluminum has a low sputtering threshold than the zirconium.

Therefore during the plasma assisted vapour deposition of the ceramic thermal barrier coating while the second layers are being deposited, the DC or RF voltage applied to the superalloy article causes the aluminum to be sputtered out of the second layers if the magnitude of the DC or PF voltage is greater than the sputtering threshold of aluminum. Thus the sputtering of the aluminum out of the second layers causes the composition of the second layers to change, it would change to a mixture of yttria stabilized zirconia and alumina with a lower level of alumina or possibly to simply yttria stabilised zirconia if all the aluminum was removed. The difference in composition between the second layers and the first and third layers will produce a reduction in phonon thermal conductivity of the ceramic thermal barrier coating. Thus the DC or RF voltage used during deposition of the second layers is selected to be sufficiently high in magnitude in a negative sense to cause sputtering of the aluminum out of the mixture of yttria stabilized zirconia and alumina. Similarly if other elements with low sputtering thresholds are used in the ceramic thermal barrier coating.

It is also possible to produce the first, second and third layers of the ceramic thermal barrier coating by chemical vapour deposition or combustion chemical vapour deposition using the three different levels of voltage applied to the metallic article. Combustion chemical vapour deposit on is disclosed in International Patent Application WO9721848A, published Jun. 19,1997.

Figure 9:
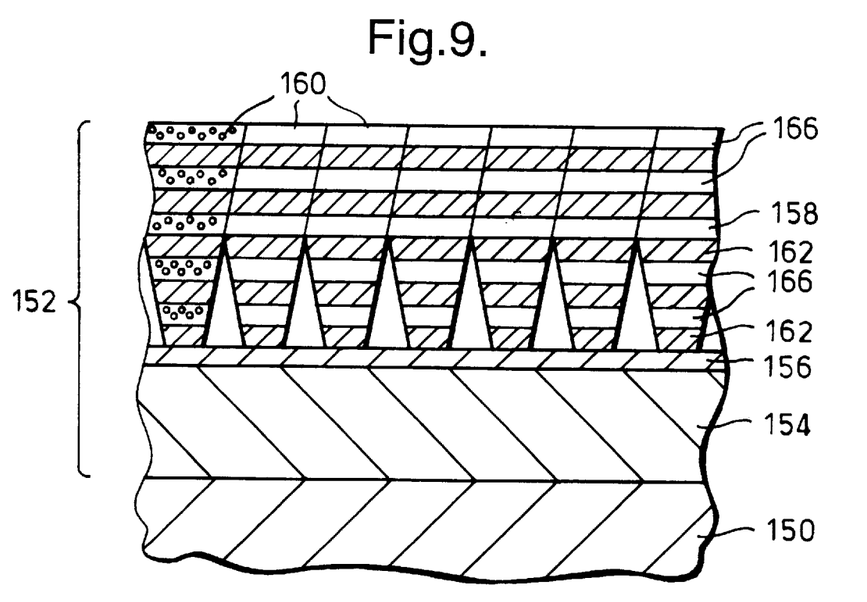
FIG. 9 is a cross-sectional diagrammatic view through a metallic article having a further thermal barrier coating according to the present invention.

Referring to FIG. 9, illustrating a further embodiment of the present invention, there is shown part of a superalloy article 150 provided with a multi-layer thermal barrier coating indicated generally by numeral 152. It is shown in the as manufactured condition. The thermal barrier coating 152 comprises a bond coating 154 on the superalloy substrate 150, an oxide layer 156 on the bond coating 154 and a ceramic thermal barrier coating 158 on the oxide layer 156. The bond coating 154 is generally an aluminum containing alloy for example a MCrAlY alloy, a nickel aluminide, a cobalt aluminide or a platinum aluminide. The oxide layer generally comprises alumina together with other oxides.

The ceramic thermal barrier coating 158 comprises a plurality of columnar ceramic grains 160 which extend substantially perpendicularly to the surface of the superalloy substrate 150. Furthermore it is seen that the columnar grains 160 of the ceramic thermal barrier coating 158 comprise a plurality of first layers 162, and a plurality of second layers 166. The layers 162 and 166 have different structures and all of the first layers 162 have the same structure and all of the second layers 166 have the same structure.

These differences in structure produce interfaces between the layers 162 and 166 which reduce the thermal conductivity of the ceramic thermal barrier coating 158. Each of these layers have voids. The voids in the first layer are naturally occurring thermal vacancies. The voids in the second layer are due to the entrapment of gas into the ceramic during the deposition of the ceramic thermal barrier coating 158. However, the second layers 166 have a greater proportion of voids 168 than do the first layers 162. This greater proportion of voids 168 in the second layers 166 also reduces the phonon thermal conductivity of the ceramic thermal barrier coating 158.

The thickness of some of the first layers and some of the second layers may be in the range 0.5 to 3 microns to reduce photon thermal conductivity. Alternatively the thickness of some of the first layers and some of the second layers may be in the range 0.3 to 2 nm to reduce phonon thermal conductivity.

The multi-layer thermal barrier coating 152 is applied on the superalloy article 150 by firstly depositing a MCrAlY alloy bond coating 154 by plasma spraying or physical vapour deposition or forming a nickel aluminide bond coating 154 by diffusion aluminizing or forming a platinum aluminide bond coating 154 by platinum modified diffusion alumunizing. The ceramic thermal barrier coating 158 is then applied onto the bond coating 154 by physical vapour deposition, usually electron beam physical vapour deposition. The oxide layer 156 forms on the bond coating 154 while the superalloy article 150 is heated up to the operating temperature in an electron beam physical vapour deposition chamber due to the presence of oxygen.

Figure 10:
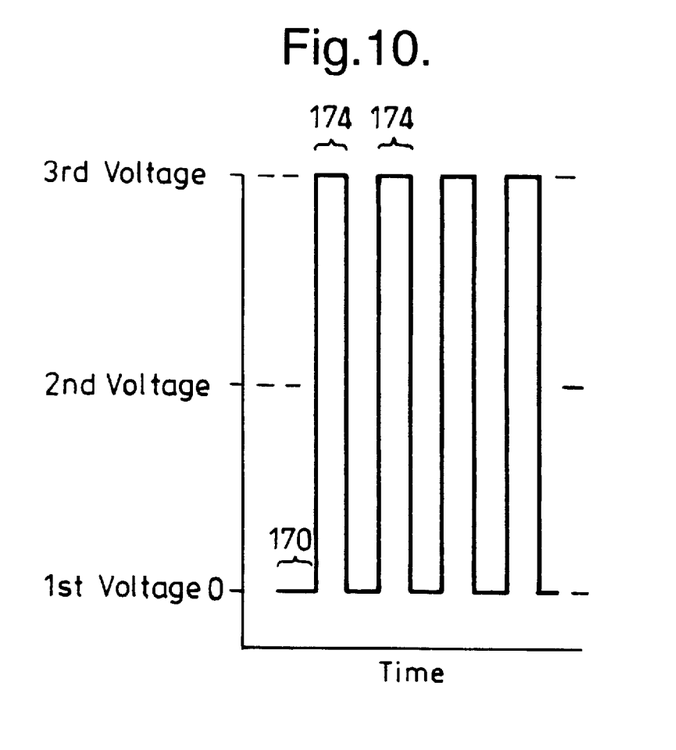
FIG. 10 is a graph showing voltage applied to the metallic article against time during application of a thermal barrier coating according to the present invention.
Figure 11:
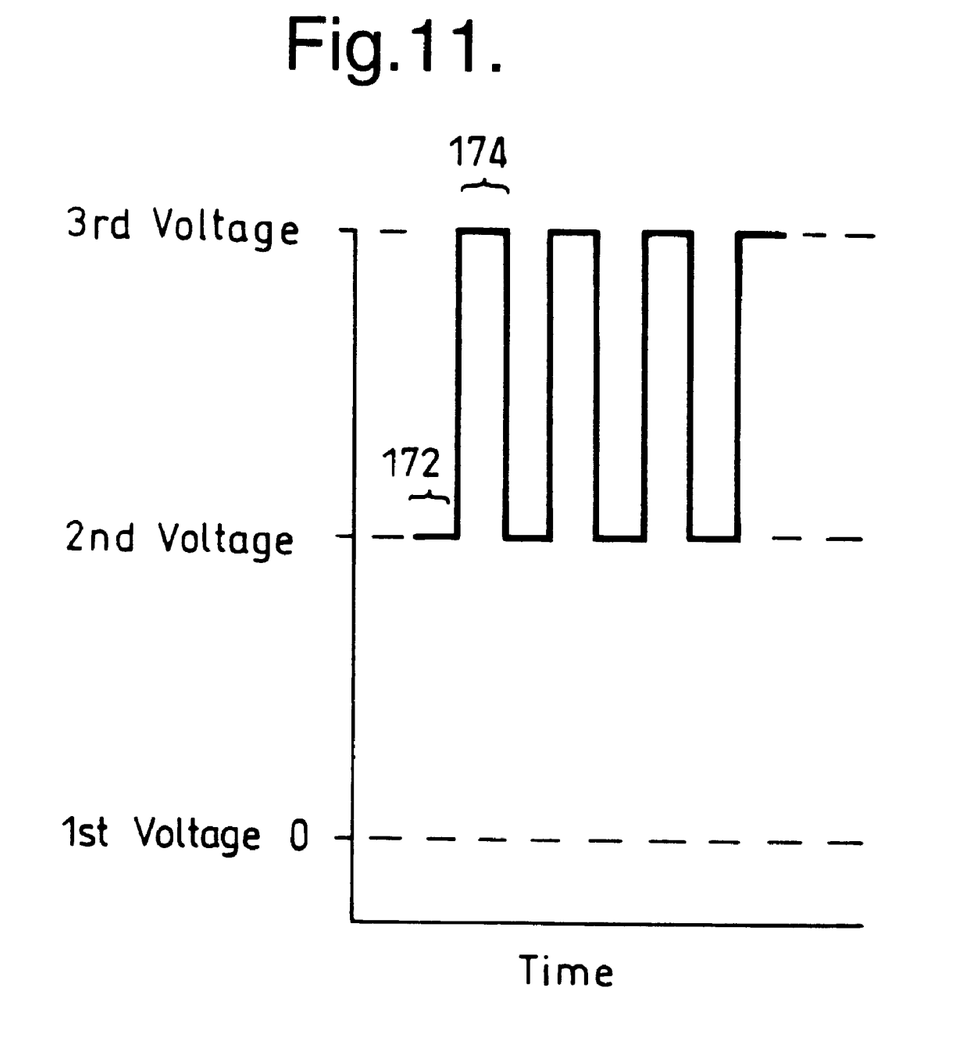
FIG. 11 is a graph showing voltage applied to a metallic article against time during application of a thermal barrier coating according to the present invention.

During the deposition of the ceramic thermal barrier coating 158, the ceramic thermal barrier coating 158 may be deposited by plasma assisted physical vapour deposition and by physical vapour deposition as is shown in FIG. 10. Alternatively the ceramic thermal barrier coating may be deposited by plasma assisted physical vapour deposition only as shown in FIG. 11. During physical vapour deposition, as shown in FIG. 10, at time periods 170, no voltage is applied to the superalloy article 150 and the first layers 162 are formed and during the plasma assisted physical vapour deposition time periods 174, a large negative DC or RF bias voltage is applied to the superalloy article 150 and the second layers 166 are formed. During plasma assisted physical vapour deposition, as shown in FIG. 11, at time periods 172 and 174, a DC or RE bias voltage is applied to the superalloy article 150. The voltage at time periods 72 is less negative than the voltage at time periods 74 and the first layers 162 are formed during the plasma assisted physical vapour deposition time periods 172, and the second layers 166 are formed during the plasma physical vapour deposition time periods 174.

The plasma assisted physical vapour deposition time periods 172 and 174 produce changes to the structure of the columnar ceramic grains 160. The time periods 174 produce a greater change in the structure than the time periods 172. Additionally during the time periods 174 a greater amount of the inert gas in the deposition chamber is trapped in the second layers 166, to produce voids 168 due to the increased speed of the ceramic particles being deposited.

I claim:

1. A metallic article comprising a bond coating on the metallic article and a ceramic thermal barrier coating on the bond coating, the ceramic thermal barrier coating comprising a plurality of columnar grains extending substantially perpendicularly to the surface of the metallic article, each columnar grain having at least one first layer and at least one second layer, the at least one first layer having a different structure to the at least one second layer, the at least one second layer having a greater proportion of voids than the at least one first layer and the voids containing an inert gas to stabilize the voids.

2. A metallic article as claimed in claim 1 wherein each columnar grain has at least one third layer, the third layer having a different structure to the at least one first layer and the at least one second layer, the at least one first layer having the same composition as the at least one third layer, the at least one second layer having a greater proportion of voids than the at least one third layer.

3. A metallic article as claimed in claim 1 wherein the at least one second layer has a different composition to the at least one first layer.

4. A metallic article as claimed in claim 2 wherein the at least one second layer has a different composition to the at least one first layer and the at least one third layer.

5. A metallic article as claimed in claim 1 wherein there are a plurality of first layers and a plurality of second layers.

6. A metallic article as claimed in claim 2 wherein each second layer is arranged between a third layer and a first layer, the second layer is adjacent to the third layer and the first layer.

7. A metallic article as claimed in claim 2 wherein each second layer is arranged between two third layers, the second layer is adjacent to the third layers.

8. A metallic article as claimed in claim 2 wherein each second layer is arranged between two first layers, the third layer is adjacent to the first layers.

9. A metallic article as claimed in claim 2 wherein some of the first layers, some of the second layers and some of the third layers have a thickness in the range 0.5 to 3 microns to reduce photon thermal conductivity.

10. A metallic article as claimed in claim 2 wherein some of the first layers, some of the second layers and some of the third layers have a thickness in the range 0.3 to 2 nm to reduce phonon thermal conductivity.

11. A metallic article as claimed in claim 1 wherein the bond coating comprises an aluminum containing bond coating on the metallic article, the aluminum containing bond coating has an alumina surface layer, the ceramic thermal barrier coating is arranged on the alumina layer.

12. A metallic article as claimed in claim 1 wherein the aluminum containing bond coating comprises a MCrAlY bond coating or a diffusion aluminide coating.

13. A metallic article as claimed in claim 1 wherein the bond coating comprises a MCrAlY bond coating on the metallic article, a platinum enriched MCrAlY layer on the MCrAlY bond coating, a platinum aluminide layer on the platinum enriched MCrAlY layer, the platinum aluminide layer has an alumina surface layer, the ceramic thermal barrier coating is arranged on the alumina layer.

14. A metallic article as claimed in claim 1 wherein the metallic article has an alumina surface layer, the ceramic thermal barrier coating is arranged on the alumina layer.

15. A metallic article as claimed in claim 1 wherein the metallic article comprise a nickel superalloy article or a cobalt superalloy article.

16. A metallic article as claimed in claim 1 wherein the metallic article is selected from the group consisting of a turbine blade and a turbine vane.

17. A metallic article as claimed in claim 1 wherein the ceramic thermal barrier coating comprises zirconia.

18. A metallic article as claimed in claim 17 wherein the ceramic thermal barrier coating comprises yttria stabilized zirconia.

19. A metallic article as claimed in claim 1 wherein the ceramic thermal barrier coating comprises a mixture of a first ceramic and a second ceramic, the second ceramic comprises an element with a lower sputtering threshold than the elements of the first ceramic.

20. A metallic article as claimed in claim 19 wherein the ceramic thermal barrier coating comprises a mixture of zirconia and alumina.

21. A metallic article as claimed in claim 20 wherein the ceramic thermal barrier coating comprises a mixture of yttria stabilized zirconia and alumina.

22. A metallic article as claimed in claim 1 wherein the voids in the at least one second layer contain a gas selected from the group consisting of krypton, xenon and argon.

23. A metallic article as claimed in claim 1 wherein some of the first layers and some of the second layers have a thickness in the range 0.5 to 3 microns to reduce photon thermal conductivity.

24. A metallic article as claimed in claim 1 wherein some of the first layers and some of the second layers have a thickness in the range of 0.3 to 2 nm to reduce phonon thermal conductivity.

25. A method of applying a ceramic thermal barrier coating to a metallic article comprising the steps of: forming a bond coating on the metallic article, applying a ceramic thermal barrier coating to the bond coating by applying a first voltage to the metallic article and depositing at least one first columnar grained layer by vapor deposition, substantially instantaneously applying a second different voltage to the metallic article and depositing at least one second columnar grained layer by plasma assisted vapor deposition to provide differences in structure between the at least one first layer and the at least one second layer, depositing the ceramic thermal barrier coating in an atmosphere containing an inert gas and selecting the second voltage such that it is sufficient to trap the inert gas in the at least one second layer to provide a greater proportion of voids in the at least one second layer, the voids containing the inert gas stabilize the voids.

26. A method as claimed in claim 25 comprising substantially instantaneously applying a third different voltage to the metallic article and depositing at least one third columnar grained layer by plasma assisted vapor deposition.

27. A method as claimed in claim 25 comprising applying a first voltage less than zero volts and applying a second voltages less than the first voltage.

28. A method as claimed in claim 26 comprising applying a first voltage of zero volts, applying a second voltage less than the first voltage and applying a third voltage less than the first voltage and greater than the second voltage.

29. A method as claimed in claim 25 comprising applying a DC voltage or a RF voltage.

30. A method as claimed in claim 25 wherein the at least one second layer has a different composition to the at least one first layer.

31. A method as claimed in claim 26 comprising depositing a plurality of first layers, a plurality of second layers and a plurality of third layers.

32. A method as claimed in claim 31 comprising depositing each second layer between a third layer and a first layer, and such that the second layer is adjacent to the third layer and the first layer.

33. A method as claimed in claim 31 comprising depositing each second layer between two third layers, and the second layer is adjacent to the third layers.

34. A method as claimed in claim 25 comprising depositing each second layer between two first layers, and the second layer is adjacent to the first layers.

35. A method as claimed in claim 26 comprising depositing some of the first layers, some of the second layers and some of the third layers to a thickness in the range 0.5 to 3 microns.

36. A method as claimed claim 26 comprising depositing some of the first layers, some of the second layers and some of the third layers to a thickness in the range 0.3 to 2 nm.

37. A method as claimed in claim 25 comprising depositing the layers to the same thickness.

38. A method as claimed in claim 25 comprising depositing the layers by physical vapor deposition.

39. A method as claimed in claim 38 comprising depositing the layers by a method selected from the group consisting of electron beam evaporation, sputtering and arc evaporation.

40. A method as claimed in claim 25 comprising applying an aluminum containing bond coating on the metallic article and forming an alumina layer on the aluminum containing bond coating.

41. A method as claimed in claim 40 wherein the aluminum containing bond coating comprises a MCrAlY alloy, an aluminide or a platinum aluminide.

42. A method as claimed in claim 25 comprising applying a MCrAlY bond coating on the metallic article, forming a platinum enriched MCrAlY layer on the MCrAlY bond coating, forming a platinum aluminide layer on the platinum enriched MCrAlY layer, forming an alumina surface layer on the platinum aluminide layer.

43. A method as claimed in claims 25 comprising forming an alumina surface layer on the metallic article.

44. A method as claimed in claim 25 wherein the metallic article is formed from a nickel superalloy article or a cobalt superalloy article.

45. A method as claimed in claim 25 wherein the metallic article is selected from the group consisting of a turbine blade and a turbine vane.

46. A method as claimed in claim 25 wherein the ceramic thermal barrier coating comprises zirconia.

47. A method as claimed in claim 46 wherein the ceramic thermal barrier coating comprises yttria stabilized zirconia.

48. A method as claimed in claim 25 wherein the ceramic thermal barrier coating comprises a mixture of a first ceramic and a second ceramic, the second ceramic comprises an element with a lower sputtering threshold than the elements of the first ceramic.

49. A method as claimed in claim 48 wherein the ceramic thermal barrier coating comprises a mixture of zirconia and alumina.

50. A method as claimed in claim 49 wherein the ceramic thermal barrier coating comprises a mixture of yttria stabilized zirconia and alumina.

51. A method as claimed in claim 25 comprising depositing the columnar grained layers in an atmosphere containing krypton, xenon or argon such that the voids in the at least one third layer contain krypton, xenon or argon.

52. A method as claimed in claim 25 wherein some of the first layers and some of the second layers have a thickness in the range 0.5 to 3 microns.

53. A method as claimed in claim 25 wherein some of the first layers and some of the second layers have a thickness in the range 0.3 to 2 nm.

\* \* \* \* \*